(12) United States Patent
Collier et al.

(10) Patent No.: US 8,909,188 B2
(45) Date of Patent: Dec. 9, 2014

(54) MIXER

(71) Applicant: Cambridge Silicon Radio, Limited, Cambridge (GB)

(72) Inventors: James Collier, Suffolk (GB); Tim Newton, Suffolk (GB)

(73) Assignee: Cambridge Silicon Radio, Ltd., Cambridge (GB)

( * ) Notice: Subject to any disclaimer, the term of this patent is extended or adjusted under 35 U.S.C. 154(b) by 0 days.

(21) Appl. No.: 13/665,718

(22) Filed: Oct. 31, 2012

(65) Prior Publication Data

US 2014/0118086 A1   May 1, 2014

(51) Int. Cl.
*H04B 1/26* (2006.01)

(52) U.S. Cl.
USPC .......................................... 455/325; 455/326

(58) Field of Classification Search
CPC ............. H04B 1/00; H04B 1/24; H04B 1/26; H04B 1/30; H04B 1/44; H03C 3/00; H03D 7/00
USPC ......... 455/313, 317, 318, 320, 323, 324, 325, 455/326, 327, 330, 334; 327/355, 356
See application file for complete search history.

(56) References Cited

U.S. PATENT DOCUMENTS

| | | | | |
|---|---|---|---|---|
| 3,697,893 A | * | 10/1972 | Faustlin et al. | 455/325 |
| 8,498,605 B1 | * | 7/2013 | Cook et al. | 455/333 |
| 2010/0253354 A1 | * | 10/2010 | Hulbert et al. | 327/356 |

FOREIGN PATENT DOCUMENTS

| | | |
|---|---|---|
| CN | 103281078 | 9/2013 |
| CN | 103326668 | 9/2013 |
| WO | 2010/109841 | 9/2010 |

OTHER PUBLICATIONS

Lopez, et al., "Mixing in a 220MHz CMOS-MEMS", IEEE, 2007, pp. 2630-2633.
Uranga, et al., "Fully Integrated MIXLER based on VHF CMOS-MEMS Clamped Clamped Beam Resonator", Electronic Letters, Apr. 12, 2007, 43:8, pp. 2-3.
Wong, et al., Micromechanical Mixer-Filters ("Mixlers"), IEEE, 2004, pp. 100-112.

* cited by examiner

*Primary Examiner* — Thanh Le
(74) *Attorney, Agent, or Firm* — Pillsbury Winthrop Shaw Pittman LLP

(57) ABSTRACT

A frequency shifter configured to shift the frequency of a signal, the frequency shifter comprising: a resonant structure configured to mechanically resonate at a first frequency; and a plurality of capacitors, each capacitor having a variable plate separation distance, wherein the resonant structure is configured to cause the plate separation distance of each capacitor to oscillate so as to cause the frequency of the signal to shift by the first frequency.

14 Claims, 1 Drawing Sheet

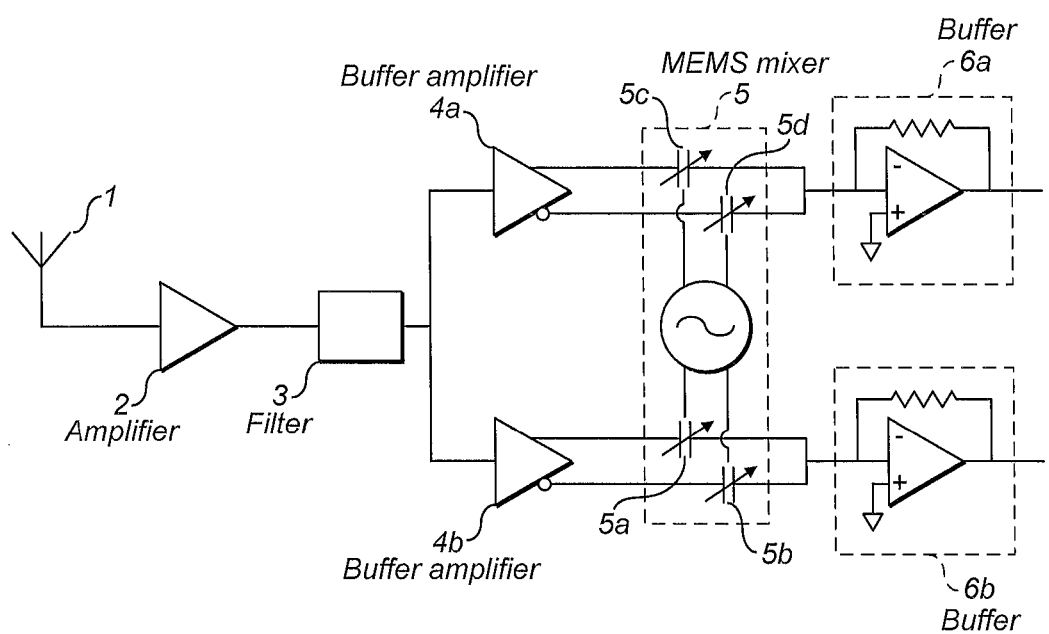

MIXER

BACKGROUND OF THE INVENTION

This invention relates to a mixer, and especially to a mixer comprising micro-electromechanical systems (MEMS) components.

Some radio frequency (RF) devices require frequency references. At present such frequency references are usually made from quartz, which can readily be driven to oscillate in a frequency range of 1-50 MHz. Radio signals, however, may oscillate at a different frequency, such as in the region of 1 to 3 GHz. Hence to provide a radio frequency reference signal from a quartz reference device one has to derive a radio frequency signal from the oscillation of the quartz device. This is usually done by an electronic oscillator and phase-locked loop, providing a "local oscillator". Conventionally this operates at or near to the RF carrier to be used by the radio frequency device. Such local oscillator systems can be power-hungry and complex. Furthermore, since the typical resonators used in portable wireless communication transceivers utilise off-chip resonator technologies, such as the quartz resonator, these off-chip resonator components contribute to a substantial percentage of portable transceiver area taken up on the circuit board.

It is possible to fabricate MEMS resonators which have radio frequency resonance. MEMS devices involve the integration of mechanical elements and electronics. A MEMS device is normally made on a single silicon substrate. It can be made through microfabrication technology. While the electronics are typically fabricated using integrated circuit process sequences (e.g., CMOS, Bipolar, or BICMOS processes), the micromechanical components are typically fabricated using compatible "micromachining" processes, for example, that selectively etch away parts of the silicon wafer or add new structural layers to form the mechanical and electromechanical devices.

By fabricating MEMS oscillators on a die that comprises the electrically active circuits (such as CMOS amplifiers, analogue to digital converters and logic), the need for off-chip resonator components would be reduced, thus saving power and reducing circuit size.

There is therefore a need to effectively and efficiently implement MEMS oscillators in radio receivers and transmitters.

BRIEF SUMMARY OF THE INVENTION

According to a first aspect of the disclosure there is provided a frequency shifter configured to shift the frequency of a signal, the frequency shifter comprising: a resonant structure configured to mechanically resonate at a first frequency; and a plurality of capacitors, each capacitor having a variable plate separation distance, wherein the resonant structure is configured to cause the plate separation distance of each capacitor to oscillate so as to cause the frequency of the signal to shift by the first frequency.

Suitably, the signal comprises: a first component and a second component inverse to the first component, the first component being applied to one of the capacitors to form a first intermediate signal, the second component being applied to another one of the capacitors to form a second intermediate signal, and an output signal being formed by adding the first and second intermediate signals together.

Suitably, the frequency shifter further comprises a driver configured to drive the resonant structure.

Suitably, the phase of each said oscillation being dependent on the position of the respective capacitor with respect to the resonant structure.

Suitably, the said oscillation of each capacitor being out of phase with the said oscillation(s) of the other capacitor(s).

Suitably, the plurality of capacitors comprises a first pair of capacitors.

Suitably, the frequency shifter further comprises a second pair of capacitors and the said oscillation of each capacitor of the first pair being out of phase by 90 degrees with the said oscillation of each capacitor of the second pair.

Suitably, the said oscillation of each capacitor being out of phase by 180 degrees with the said oscillation of the capacitor that said each capacitor is paired with.

According to a second aspect of the disclosure there is provided a receiver comprising the frequency shifter described above, the receiver being arranged to receive an incoming signal, the frequency shifter being arranged to shift the frequency of the incoming signal.

Suitably, the receiver further comprises: an input for receiving an incoming signal; a first input buffer arranged to buffer the incoming signal and provide the signal to the frequency shifter.

According to a third aspect of the disclosure there is provided a receiver comprising: an input for receiving an incoming signal; a frequency shifter as described above; a first input buffer arranged to buffer the incoming signal and provide the signal to the first pair of capacitors; and a second input buffer arranged to buffer the incoming signal and provide the signal to the second pair of capacitors.

Suitably, the receiver further comprises: a first output buffer arranged to buffer the signal output from the first pair of capacitors; and a second output buffer arranged to buffer the signal output from the second pair of capacitors.

According to a fourth aspect of the disclosure there is provided a transmitter comprising a frequency shifter as described above, the transmitter being arranged to transmit a signal shifted by the frequency shifter.

BRIEF DESCRIPTION OF THE DRAWINGS

The present invention will now be described by way of example. For a better understanding of the present invention, reference is made to the following drawing, in which FIG. 1 shows a receiver.

DETAILED DESCRIPTION OF THE INVENTION

The present invention relates to a mixer or heterodyning stage that shifts or changes the frequency of a signal. The mixer (or frequency shifter) comprises a resonant structure that is configured to mechanically resonate at a desired frequency. The resonant structure may be a physical structure defined on a substrate. The resonant structure may, for example, be a vibrating beam micromechanical resonator, a vertical displacement resonator, a film bulk acoustic wave resonator, or any other suitable MEMS resonator. The type of resonant structure chosen may be dependent on the desired requirements such as resonance frequency, selectivity, and quality factor (Q) requirements.

The mixer may comprise a pair of variable capacitors. One or both of the capacitors may be configured in such a way that its capacitance at any time is dependent on the state of the resonant structure at that time. The capacitance of such a capacitor may thus oscillate in value as the resonant structure oscillates. The phase of oscillation of the capacitance of each capacitor relative to the oscillation of the resonant structure may be dependent on the position of the capacitor with respect to the resonant structure. In one example, the pair of capacitors may be positioned relative to the resonant structure such that the phase of oscillation of the capacitance of one of the capacitors is out of phase with the other capacitor by 180 degrees.

The signal to be frequency shifted may comprise two components: a first component and a second component that is inverse to the first component. The first component can be applied to one of the paired capacitors to form a first intermediate signal and the second component can be applied to the other capacitor to form a second intermediate signal. The variation in the capacitance of the capacitors can cause the first and second intermediate signals to be formed from the first and second components respectively. In this way, the formation of the first and second intermediate signals is dependent on the oscillation of the resonant structure. The first and second intermediate signals may be added together to form the frequency shifted signal that is outputted by the mixer.

In the following, various embodiments of a GPS receiver are utilised to illustrate the invention. It is not intended to limit the scope of the invention or its application of uses. For example, the present invention can be applied to transmitters and to the transmission and reception of other RF signals, and to signals outside the RF band.

FIG. 1 shows an embodiment of the present invention implemented as part of a GPS receiver.

Generally, the GPS receiver of FIG. 1 operates as follows. The incoming signal, in the case of GPS a very weak signal centred at 1.59542 GHz, is received by antenna 1. The output of the antenna is amplified by stage 2, which may be a low noise amplifier. The amplified signal may then be filtered by a band-pass filter 3 to reject unwanted signals, such as signals from cellular telephones. The filter 3 could be omitted if the selectivity of the other components, especially the antenna 1 is adequate. The signal from the filter (or from stage 2, if the filter is omitted) may be passed to a buffer amplifier. The output from the buffer amplifier comprises a first component and a second component that is inverse to the first component. In the example shown in FIG. 1, the signal from the filter 3 (or stage 2, if the filter is omitted) may be split and passed on to buffer amplifiers 4a and 4b so that, in this example, an in-phase (I) and a quadrature (Q) signal can be obtained after mixing. The buffer amplifiers 4a and 4b each present a voltage output, and the complement, to four ports of a MEMS oscillator/mixer device 5 which comprises a resonant structure that is configured to mechanically resonate at a desired frequency. The resulting lower frequency (heterodyned) signals from the MEMS oscillator/mixer device 5 are converted from current signals to voltage signals and buffered by stages 6a and 6b.

The output from stages 6a and 6b may be in-phase (I) and quadrature (Q) signals. The I and Q signals may be supplied to a baseband processing section (not shown). The baseband processing section processes the received signals to recover traffic data from them. It may use the I and Q signals to distinguish between image frequencies and form a representation of the signal received at a particular frequency, and then identify the data symbols represented by that signal. The processing performed by the baseband processing section may be done in the digital domain.

The MEMS mixer 5 may comprise a structure that is configured to resonate at a desired frequency. The resonant structure may be designed and manufactured such that it resonates at the desired frequency. For example, the resonant structure may be dimensioned and/or shaped and/or comprise of one or more particular materials so that it mechanically resonates at the desired frequency. The resonant structure may be fabricated such that the signal output from the MEMS mixer 5 has a convenient frequency for subsequent processing. In the example of the GPS receiver, a convenient frequency for subsequent processing may be 4 MHz. If the frequency of the signal received by the MEMS mixer 5 is 1.57542 GHz (i.e. the centre frequency of the desired signal received by antenna 1), then the resonant structure may be fabricated such that it resonates at 1.57142 GHz or 1.57942 GHz. The MEMS mixer 5 effectively shifts the frequency of the incoming signal by forming a signal that is the difference between the resonant frequency of the resonant structure and the incoming signal.

The MEMS mixer 5 may comprise a driver that is configured to drive the resonant structure such that the resonant structure mechanically resonates at its resonant frequency. The driver may supply energy to the resonant structure so as to drive and sustain the oscillation of the resonant structure at its resonant frequency. The driver may detect the motion of the resonant structure and apply an appropriate amount of energy so as to maintain the motion of the resonant structure at an appropriate amplitude. The driver may be an electronic circuit that applies an electronic signal to the resonant structure. Such drivers are generally known in the field of MEMS resonators.

The MEMS mixer 5 may comprise a set of capacitors that have a variable capacitance. The capacitors can be arranged such that the capacitance of each capacitor varies in dependence of the oscillation of the resonant structure. For example, the capacitors may be a set of air-gap (or vacuum gap) capacitors that have a plate separation distance which can be varied. The capacitors can be arranged such that the distance between the plates can vary with the oscillation of the resonant structure. The variation in the distance between the plates of a capacitor causes a variation in its capacitance. The capacitance of a capacitor may be varied by other appropriate means such as varying the plate area of the capacitor by, for example, varying the area of overlap between the plates of the capacitor.

Another example means of varying the capacitance may be by varying the dielectric constant of the capacitor by, for example, having a material with a specified dielectric constant oscillating in and out of the gap between the capacitor plates, wherein the dielectric material is part of or attached to the resonant structure. For example, one of the plates of each capacitor may be attached to the resonant structure and the other of the plates of each capacitor may be attached to the substrate with respect to which the resonant structure oscillates. In that way the distance between the plates will vary as the resonant structure moves.

The phase of oscillation of the capacitor plate separation distance may be dependent on the position of the capacitor with respect to the resonant structure. For example, at a first position on an oscillating resonant beam structure the beam may be at a maximum position (relative to a fixed position) and at the same time at a second position on the oscillating resonant beam structure, the beam may be at a minimum position (relative to the same or another fixed position). Thus if a plate of a first capacitor was positioned at the first position on the beam and a plate of a second capacitor was positioned at the second position on the beam, then the oscillation of the first and second capacitor plate separation distances may be 180 degrees out of phase.

The capacitors may be positioned relative to the resonant structure and relative to each other such that the oscillations of the plate separation distances are out of phase. For example, in the case of the GPS receiver of FIG. 1, the capacitors 5a-5d can be positioned such that the relative plate separation distance oscillation between capacitors 5a, 5b, 5c and 5d is $$\sin(\omega_0 t), -\sin(\omega_0 t), \cos(\omega_0 t), -\cos(\omega_0 t),$$

respectively, where $\omega_0$ is the angular frequency of oscillation of the resonant structure.

The separation distance of the plates for capacitors 5a, 5b, 5c and 5d respectively will therefore be:

$$d_a = d_0(1 + x \sin(\omega_0 t))$$

$$d_b = d_0(1 - x \sin(\omega_0 t))$$

$$d_c = d_0(1 + x \cos(\omega_0 t))$$

$$d_d = d_0(1 - x \cos(\omega_0 t))$$

The input to the capacitors 5c and 5d is a positive and negative voltage component respectively provided by buffer amplifier 4a. The positive component is provided to capacitor 5c, which outputs a first intermediate signal and the negative component is provided to capacitor 5d, which outputs a second intermediate signal. The first and second intermediate signals are added together to provide the output signal that is provided to stage 6a.

In more detail, the current through each capacitor is $$C \cdot \frac{dV}{dt}$$

and $$C = \frac{\text{Area}}{\varepsilon \times \text{seperation of plate}}$$

Thus $$V_0 I = i \cdot R$$
$$= \frac{AV}{\varepsilon d_0(1 - x \cos \omega t)} - \frac{AV}{\varepsilon d_0(1 + x \cos \omega t)}$$
$$\simeq k \cdot V \cos \omega t$$

Thus the multiplication by sinusoid required for heterodyning is obtained and the resulting combined output signal from capacitors 5c and 5d is a signal that has been frequency shifted from the signal input to the capacitors 5c and 5d. Similarly, the combined output from capacitors 5a and 5b provides a signal that has been frequency shifted from the signal input to the capacitors 5a and 5b and is out of phase by 90 degrees with the combined signal outputted by capacitors 5c and 5d.

Thus, the system shown in FIG. 1 comprises a mixer in which a first incoming signal is in effect mixed with a second incoming signal to form an output signal that has components representing the sum and the difference between the incoming signals. Unlike in a conventional mixer the first and second signals are not mixed by being applied to a common electrical component. In this mixer, one signal is applied to an electrical component and the performance of that component is dependent on the application of the second signal to a mechanical component. The first incoming signal could be received from outside the device, for example a received RF signal. The second incoming signal could be generated within the device, for example by oscillation. In the system of FIG. 1, the second incoming signal results from the physical oscillation of an element. That element is preferably integral with the substrate on which the remainder of the circuit is defined, but it could be a separate element. The element may be driven to oscillate by being excited, e.g. electrically. The mixer takes a representation of received signal, which could be formed from amplification, filtering etc. of the received signal, and an inverted version of that representation. The representation and its inverse can each applied to one plate of a respective capacitor. The signals on the other plates of the two capacitors are added together to form the output signal. At least one plate of each capacitor is physically coupled to the oscillating element. The plates are coupled to the oscillating element in such a way that, due to the physical characteristics of the oscillating element (a) the capacitances of the capacitors will oscillate at a desired frequency, which could be the resonant frequency of the oscillating element, and (b) the relationships between the capacitances of the capacitors are out of phase by 180°. To achieve this, the capacitances could be spaced apart on the element and/or could be on opposite sides of the element. The capacitors could each be on separate elements if desired. In a practical receiver it is desirable to have I and Q signals for baseband processing. To obtain such signals it is preferred that a second similar pair of capacitors is provided, each of which is 90° out of phase with those of the first pair. These produce a second output signal.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description it will be evident to a person skilled in the art that various modifications may be made within the scope of the invention.

The invention claimed is:

1. A frequency shifter configured to shift the frequency of a signal, the frequency shifter comprising:
    a resonant structure configured to mechanically resonate at a first frequency; and
    a plurality of capacitors, each capacitor having a variable plate separation distance, wherein the resonant structure is configured to cause an oscillation of the plate separation distance of each capacitor so as to cause the frequency of the signal to shift by the first frequency.

2. A frequency shifter according to claim 1, wherein the signal comprises:
    a first component and a second component inverse to the first component, the first component being applied to one of the capacitors to form a first intermediate signal, the second component being applied to another one of the capacitors to form a second intermediate signal, and an output signal being formed by adding the first and second intermediate signals together.

3. A frequency shifter according to claim 1, further comprising a driver configured to drive the resonant structure.

4. A frequency shifter according to claim 1, the phase of each said oscillation being dependent on the position of the respective capacitor with respect to the resonant structure.

5. A frequency shifter according to claim 1, the said oscillation of each capacitor being out of phase with the said oscillation(s) of the other capacitor(s).

6. A frequency shifter according to claim 1, wherein the plurality of capacitors comprises a first pair of capacitors.

7. A frequency shifter according to claim 6, the said oscillation of each capacitor being out of phase by 180 degrees with the said oscillation of the capacitor that said each capacitor is paired with.

8. A frequency shifter according to claim 6, further comprising a second pair of capacitors and the said oscillation of each capacitor of the first pair being out of phase by 90 degrees with the said oscillation of each capacitor of the second pair.

9. A frequency shifter according to claim 8, the said oscillation of each capacitor being out of phase by 180 degrees with the said oscillation of the capacitor that said each capacitor is paired with.

10. A receiver comprising:
    an input for receiving an incoming signal;
    a frequency shifter according to claim 8;
    a first input buffer arranged to buffer the incoming signal and provide the signal to the first pair of capacitors; and
    a second input buffer arranged to buffer the incoming signal and provide the signal to the second pair of capacitors.

11. A receiver according to claim 10 further comprising:
    a first output buffer arranged to buffer the signal output from the first pair of capacitors; and
    a second output buffer arranged to buffer the signal output from the second pair of capacitors.

12. A receiver comprising a frequency shifter according to claim 1, the receiver being arranged to receive an incoming signal, the frequency shifter being arranged to shift the frequency of the incoming signal.

13. A receiver comprising a frequency shifter according to claim 1, the receiver further comprising:
    an input for receiving an incoming signal;
    a first input buffer arranged to buffer the incoming signal and provide the signal to the frequency shifter.

14. A transmitter comprising a frequency shifter according to claim 1, the transmitter being arranged to transmit the signal shifted by the frequency shifter.

* * * * *